US006989328B2

(12) United States Patent
Arita et al.

(10) Patent No.: US 6,989,328 B2
(45) Date of Patent: Jan. 24, 2006

(54) METHOD OF MANUFACTURING SEMICONDUCTOR DEVICE HAVING DAMASCENE INTERCONNECTION

(75) Inventors: Koji Arita, Kanagawa (JP); Kaoru Mikagi, Kanagawa (JP); Ryohei Kitao, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/777,198

(22) Filed: Feb. 13, 2004

(65) Prior Publication Data
US 2004/0161928 A1 Aug. 19, 2004

(30) Foreign Application Priority Data
Feb. 17, 2003 (JP) ............................. 2003-038361
Dec. 26, 2003 (JP) ............................. 2003-432532

(51) Int. Cl.
*H01L 21/44* (2006.01)
(52) U.S. Cl. .................. 438/674; 438/676; 438/677; 438/678; 438/687
(58) Field of Classification Search ................ 438/676, 438/677, 678, 687, 638, 674
See application file for complete search history.

(56) References Cited

U.S. PATENT DOCUMENTS

| 6,107,186 | A | 8/2000 | Erb |
| 6,140,241 | A | 10/2000 | Shue et al. |
| 6,245,676 | B1 * | 6/2001 | Ueno ........................ 438/687 |
| 6,319,831 | B1 | 11/2001 | Tsai et al. |
| 6,767,826 | B2 * | 7/2004 | Abe ........................ 438/638 |

FOREIGN PATENT DOCUMENTS

| JP | 11-238703 | 8/1999 |
| JP | 2001-217208 | 8/2001 |

* cited by examiner

*Primary Examiner*—David Neims
*Assistant Examiner*—Renee R. Berry
(74) *Attorney, Agent, or Firm*—Young & Thompson

(57) ABSTRACT

In copper plating using a damascene method, in order to prevent cost rise, dishing, erosion and the like due to the protrusion of plating on the dense wiring area to increase the time for CMP polishing, the copper plating is performed so that the current step of the copper plating has only one step for flowing current in the direction opposite to the direction of growing the plating as shown in FIG. 1. In this time, this opposite direction current step is performed under the condition of a current-time product within a range between 1.0 and 120 mA×sec/cm$^2$.

12 Claims, 7 Drawing Sheets

EXAMPLE OF THE PRESENT INVENTION

METHOD OF MANUFACTURING SEMICONDUCTOR DEVICE HAVING DAMASCENE INTERCONNECTION

BACKGROUND OF THE INVENTION

1. Field of the Invention

The present invention relates to a method of manufacturing a semiconductor device, and specifically to a method of manufacturing a semiconductor device that forms wirings of a uniform height after polishing in a damascene wiring process using a plating method.

2. Description of the Related Art

In recent years, the miniaturization of wirings and the production of multi-layer wiring have been progressed accompanying the higher integration of semiconductor devices and the size reduction of semiconductor chips, and as a method for forming a multi-layer wiring structure, there has generally been used a process known as the damascene process, wherein Cu, which is a wiring material, is simultaneously or sequentially buried in via holes and wiring-trench patterns through a Cu seed layer using an electroplating method, and planarized using CMP (chemical mechanical polishing) method to form wirings.

The generally used damascene process will be described referring to the drawings. FIG. 6 is a sectional process diagram showing the procedures of a conventional damascene process. First, as FIG. 6 (a) shows, a barrier metal layer 7 and a Cu seed layer 8 are sequentially formed in wiring-trench pattern 6 opened in an etching-stop film 10 and an interlayer insulating film 5 formed on a semiconductor substrate 4.

Next, as FIG. 6 (b) shows, a Cu plating layer 9 is formed until the wiring-trench pattern 6 is sufficiently buried using an electroplating method. Next, as FIG. 6 (c) shows, the surface is planarized until the interlayer insulating film 5 is exposed using a CMP method to form damascene wirings.

Here, the reaction involved in the electroplating method will be described referring to FIG. 7. In the damascene process, a plating bath containing a suppressor 15, a brightener 16 and the like is used to bury fine patterns free of voids. The suppressor 15 has an effect to suppress the growth of plating, and an effect to densify the plating film. On the other hand, the brightener 16 has an effect to accelerate the growth of plating. As FIG. 7 (a) shows, since the brightener 16 evenly adsorbed in the initial stage of growth is retained on the adsorbing surface, in the state of FIG. 7 (b) wherein the growth of the Cu plating layer 9 has been progressed, a concentration gradient is produced on the surface. This concentration gradient causes the growing reaction called bottom up wherein the growth of the bottom of the wiring-trench pattern 6 is accelerated. As FIG. 7 (a) shows, since the diffusion coefficient of the suppressor 15 is small, the concentration on the surface is higher than the concentration in the wiring-trench pattern 6, and the growth of plating on the planarized area is suppressed to assist the bottom-up effect. However, since the concentration gradient of the brightener 16 as described above is sustained even after the wiring-trench pattern 6 is filled with the wiring material, the area on the wiring-trench pattern 6 is protruded as FIG. 7 (c) shows. On the other hand, since the content gradient of the brightener 16 as described above little occurs in a wiring trench having a sufficient width, the area on the wiring-trench pattern 6 is not protruded (refer to FIG. 6 (b)).

As described above, the protrusion of the plating film occurs on fine patterns, due to the effect of the additives used for filling fine patterns without forming voids. Therefore, in the CMP process shown in FIG. 6 (c), since a long polishing time is used for completely polishing Cu on the interlayer insulating film 3 including excessive Cu protrusion due to bottom up, the costs of the CMP process increase, and erosion 13 or dishing 14 due to polishing is caused to produce variation in the wiring height.

In the above-described Cu plating method using the conventional damascene process, it is essential to use a plating bath and plating conditions having bottom-up properties to fill fine patterns without producing voids. However, in the plating method having bottom-up properties, protrusions occur on the fine patterns. As conventional examples to use the multiple stages of current steps of Cu plating, U.S. Pat. No. 6,140,241 and U.S. Pat. No. 6,319,831B1 disclose a two-step method to switch the current steps from a low current to a high current, or to provide an idling step after the low-current step. However, since these methods cannot solve the problem of protrusions on fine patterns, erosion 13 and dishing 14 after CMP are unavoidable. Although U.S. Pat. No. 6,107,186 discloses that flat CMP can be performed by protruding the plating films of high pattern densities, the load to the CMP is large, and increase in CMP costs cannot be avoided.

U.S. Pat. No. 6,245,676B1 (Japanese Patent Laid-Open No. 11-238703) discloses that flat CMP can be performed by applying a reverse bias current for removing the molecules of the suppressor in the plating solution to relatively protrude the areas on wiring-trench patterns 6 compared to the flat areas. In this method also, the load to the CMP is large, and increase in CMP costs cannot be avoided, as in the above-described U.S. Pat. No. 6,107,186. Although Japanese Patent Laid-Open No. 2001-217208 discloses to apply a backward current after filling the wiring-trench patterns 6 using the forward current, no detailed conditions are disclosed. The patent also discloses that the repetitive applications of polarity-inversion pulses are effective; however, the effect on the reliability of the devices is not described. Although the conditions of applying forward current after applying backward current affect the reliability of the devices, no detailed conditions are described.

As described above, in the Cu electroplating method in the conventional Damascene process, in order to fill fine patterns without producing voids, it is essential to use a plating bath and plating conditions having bottom-up properties; however, since protrusions occur on the fine patterns in the plating method with bottom-up property, there has been demanded the development of the method to solve the problem of protrusions on the fine wiring patterns without changing the filling properties of the fine patterns or the quality of plating films.

SUMMARY OF THE INVENTION

The present invention was devised considering the above-described problems, and the major object of the present invention is to solve the problems of protrusions on fine pattern portions in the Cu-plating process in the damascene process, without lowering the fine-pattern filling properties, the plating film quality, and the reliability of devices. As a result, there is provided a method for manufacturing a semiconductor device that can reduce CMP costs, suppress erosion 13 or dishing 14 occurring during CMP, and form the device having a uniform wiring height.

In order to achieve the above-described object, the method of manufacturing a semiconductor device according to the present invention is characterized in a process for forming a seed layer in a via hole or a wiring-trench formed in an interlayer insulating film formed on a semiconductor substrate, and then burying a wiring material using an electroplating method, wherein the current step of the plating method has only one step for flowing a current in the direction opposite to the direction for growing the plating. The current step is characterized in consisting of three steps: a first step for flowing a current only in the direction for growing the plating; a second step for flowing a current only in the direction opposite to the direction for growing the plating; and a third current step for flowing only in the direction identical to the first step; in the order of the first, second, and third steps.

In the method of manufacturing a semiconductor device according to the present invention, the step flowing a current only in the direction opposite to the direction for growing the plating or the second current step is preferably configured so that the absolute value of the product of the current and the time is within a range between 1.0 and 120 mA$\times$sec/cm$^2$.

Also in the method of manufacturing a semiconductor device according to the present invention, the first current step is preferably configured so that the product of the current and the time is within a range between 120 and 2700 mA$\times$sec/cm$^2$. The current value of the first current step is preferably within a range between 0.5 and 13 mA/cm$^2$. Furthermore, the current value of the third current step is preferably within a range between 16 and 90 mA/cm$^2$. The wiring material is preferably copper.

The present inventors examined the method of electroplating having a backward current step, and found that the application time of the backward current and the optimization of the current values were very important; and that the forward current values after applying the backward current had to be optimized. Furthermore, the present inventors found that the more the number of steps applying backward current, the lower the quality of the plating film. In other words, a plating film of a high quality can be obtained, the protrusions on fine patterns can be suppressed, the time required to completely remove excessive Cu by CMP can be shortened, and CMP costs can be lowered by performing only one step of applying backward current, and by performing electroplating under conditions favorable to each of the above-described steps. Moreover, since erosion or dishing occurring when excessive Cu of CMP is completely removed can be suppressed, the Cu damascene wiring of high reliability with a uniform wiring height can be provided.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
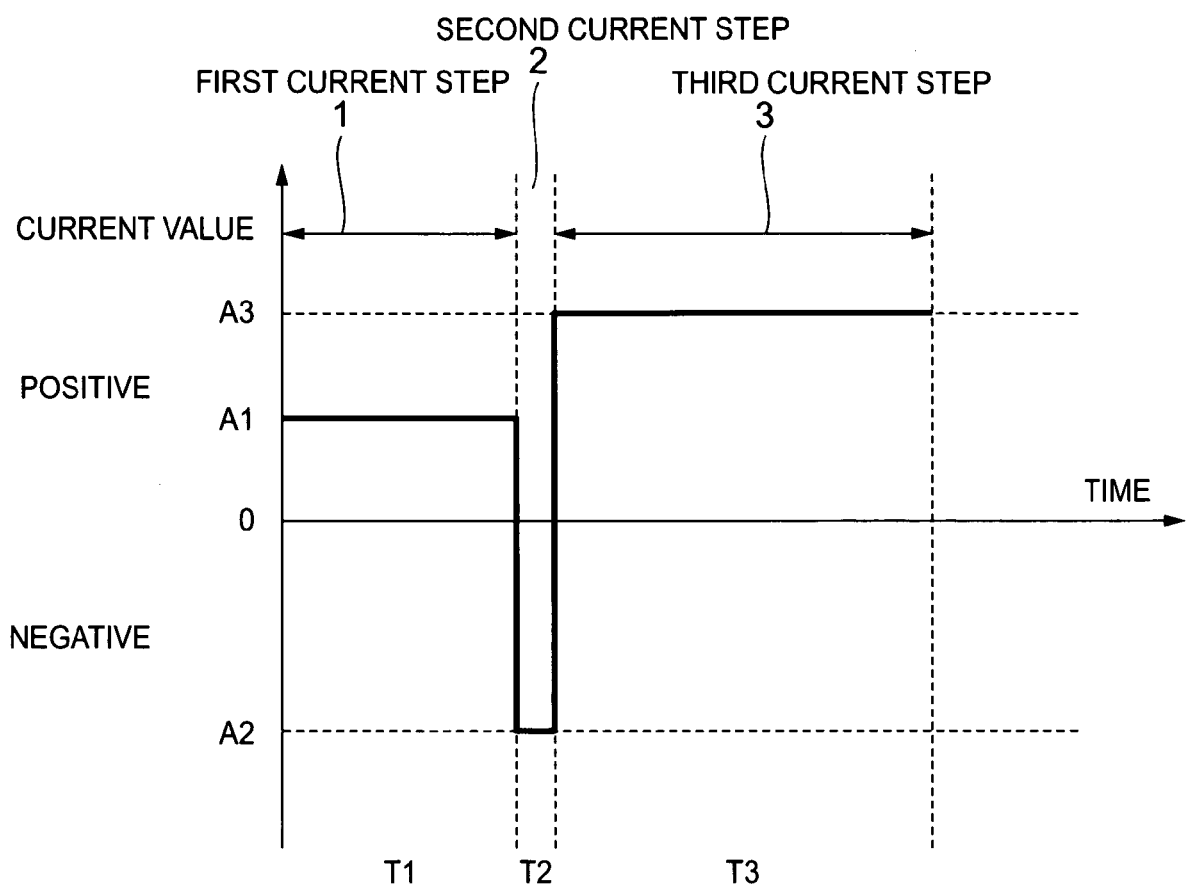
FIG. 1 is a schematic diagram illustrating the current steps of the present invention.

Next, the embodiments of a semiconductor device according to the present invention will be described referring to the drawings. In the Cu plating process in the damascene process, as shown in the conventional example, bottom-up plating using a plating bath containing a brightener and a suppressor is required to bury fine patterns without forming voids; however, protrusions occur on the fine patterns. As described above, this is caused by the concentration gradient of the brightener 16 for accelerating the plating reaction. In order to inhibit the protrusions on the wiring patterns, it is considered that the adsorption of the brightener 16 having concentration gradient caused by the bottom-up plating is once cancelled, and the film is grown again in an evenly adsorbed state. In order to desorb the adsorbed brightener 16, it is considered to be effective to apply the current in the opposite direction that releases Cu ions on the Cu plating film whereon the brightener is adsorbed (hereafter referred to as stripping). However, since the application of the backward current was considered to affect the quality of the plating film, solid films were used in the following experiments.

On a base material prepared by forming a barrier metal layer 7 and a Cu seed layer 8 on a semiconductor substrate 4, a Cu plating layer 9 was grown using an electroplating method, wherein current steps consisting of a first current step 1, a second current step 2, and a third current step 3 as shown in FIG. 1. In FIG. 1, T1, T2, and T3 denote the time of each current step, and A1, A2, and A3 denote the current value of each current step.

Table 1 shows the results of TEM observation of defects in plating films for the step time (T2) flowing the backward current, which is the second current step 2, and the current value thereof (A2). Since the growth and stripping of a plating film are performed through the giving and taking of electrons by Cu ions, the quantities of growth and stripping of the plating film are determined by the product of time and current value (hereafter referred to as product current value), that is the total quantity of electrons given and taken by the Cu ions. Therefore, product current values are shown in Table 1.

TABLE 1

| T2 (sec) | A2 (mA/cm$^2$) | T2 × A2 (mA × sec/cm$^2$) | Presence of defect observed by TEM |
|---|---|---|---|
| 2 | −16 | −32 | No |
| 5 | −16 | −80 | No |
| 7.5 | −16 | −120 | No |
| 10 | −16 | −160 | Yes |
| 2 | −32 | −64 | No |
| 3.75 | −32 | −120 | No |
| 5 | −32 | −160 | Yes |

Table 1 shows that defects in the Cu plating film do not occur when the absolute value of T2×A2, which is the product current value of the second current step 2, is 120 mA×sec/cm² or below, and occur when it is larger than 120 mA×sec/cm². If the absolute value of T2×A2 is larger than 120 mA×sec/cm², that is, if the stripping reaction proceeds significantly, it is considered that since the suppressor component present on the surface of the Cu plating film is also removed, the film does not become dense and defects occur. From the above results, it is preferable from the point of view of film quality that the absolute value of the product current value of the step for flowing the counter current is 120 mA×sec/cm² or below. On the contrary, it may be considered that the brightener is adsorbed on all the Cu atoms, and the minimum value of the stripping product current value is the charge quantity required to return Cu in 1 cm² of an atomic Cu layer in the plating liquid. When it is considered that the interatomic distance of Cu is 2.56 Å, the charge quantity of an electron is $1.60 \times 10^{-19}$ coulomb, and Cu becomes divalent ions, the minimum product current value is 0.5 mA×sec. Considering the variation and margin in the wafer, the product current value of the second current step 2 is preferably 1.0 mA×sec/cm² or above. However, it was confirmed from the following experiments that when there were two or more steps to apply backward current, defects were caused even if the total of the absolute values of product current values of the backward-current steps is 120 mA/cm² or below.

Figure 2:
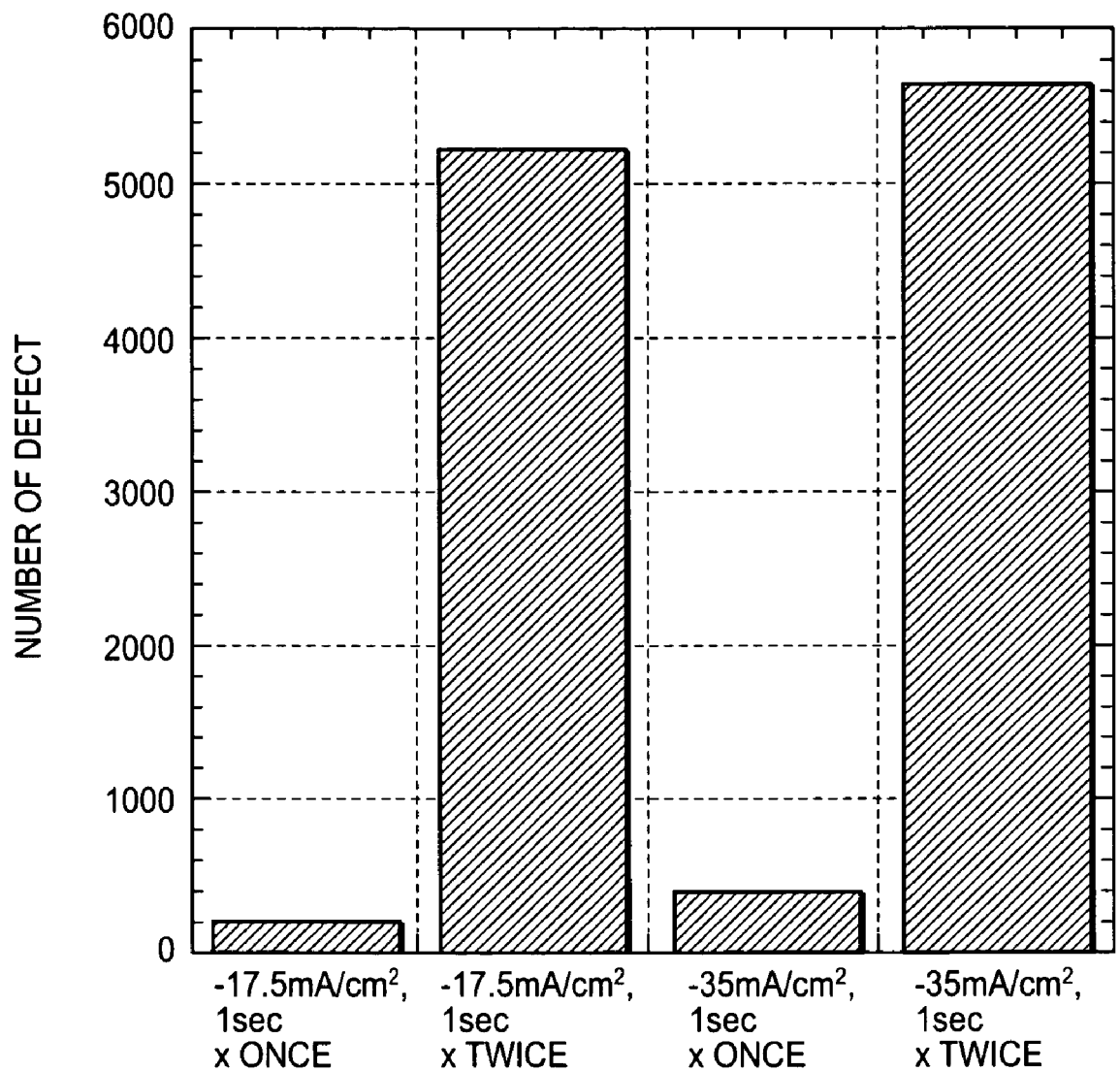
FIG. 2 is a diagram showing the effect of the number of second current steps of the present invention on the plating film quality.
Figure 3A:
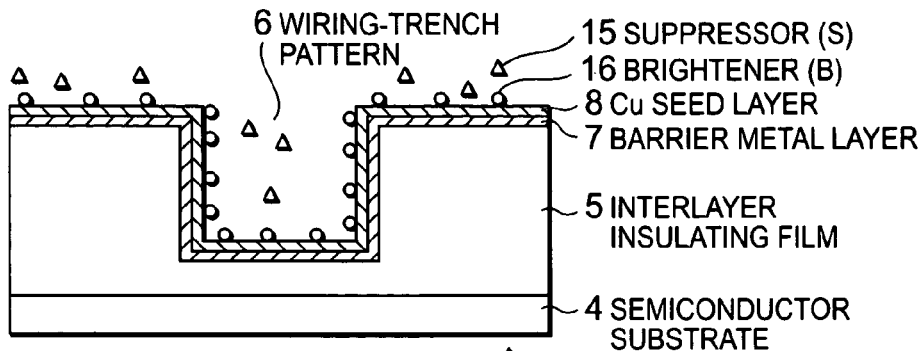
FIGS. 3 (a) to 3 (e) are schematic diagrams of the plating growing process for illustrating the effect of the present invention.
Figure 3B:
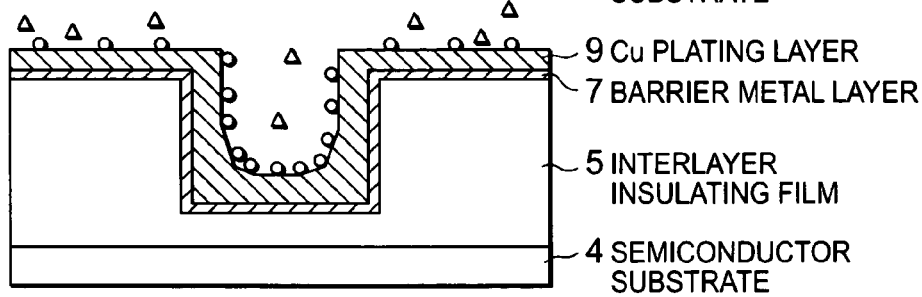
Figure 3C:
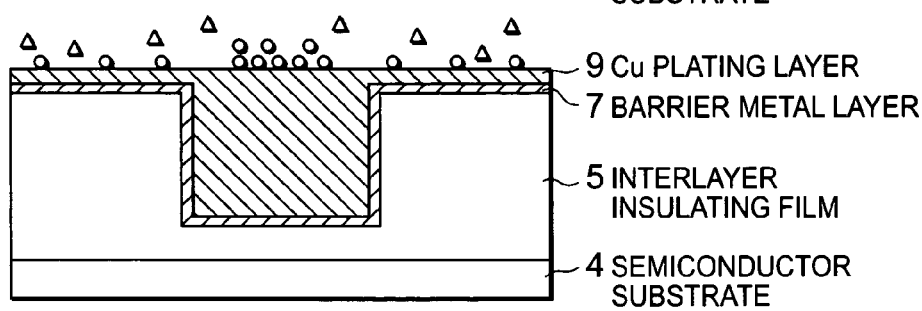
Figure 3D:
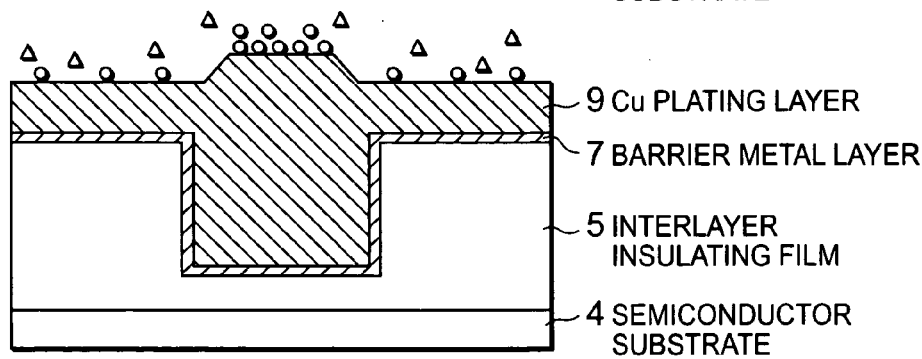
Figure 3E:
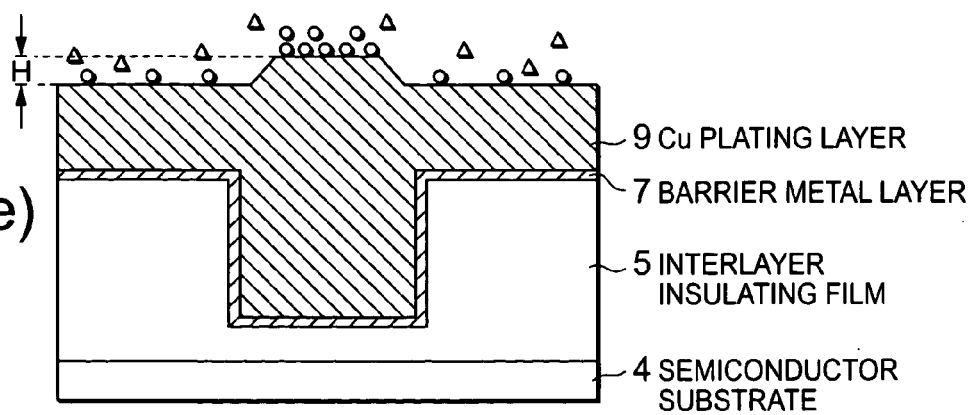
Figure 4A:
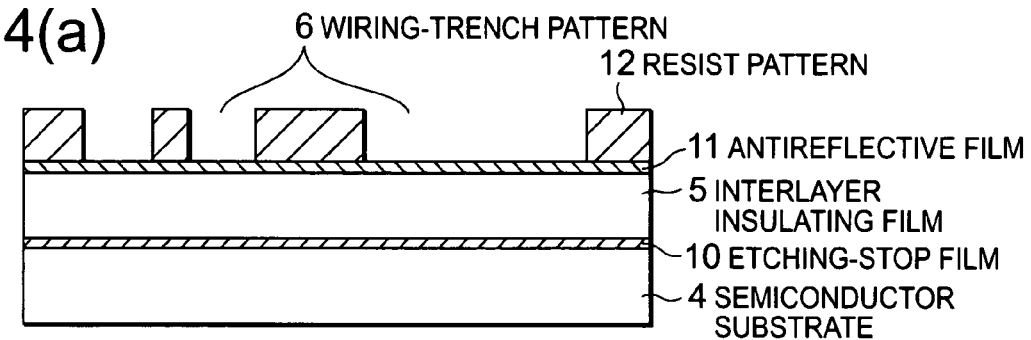
FIGS. 4 (a) to 4 (e) are sectional process diagrams showing the procedures of the damascene process according to an embodiment of the present invention.
Figure 4B:
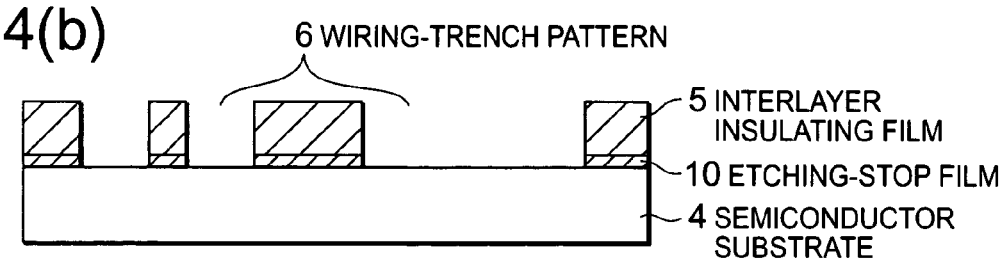
Figure 4C:
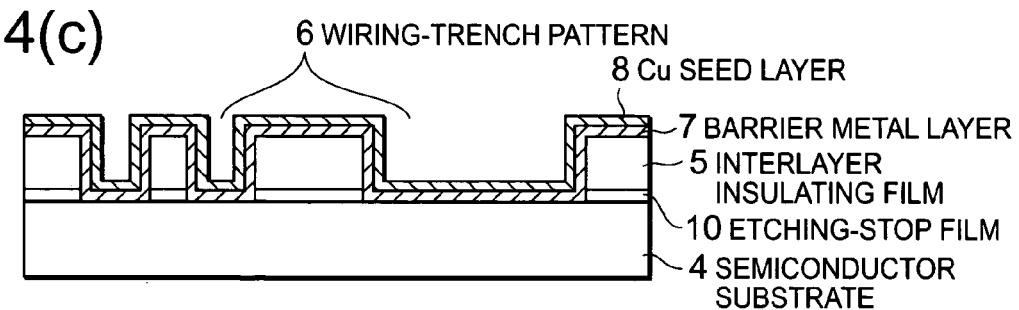
Figure 4D:
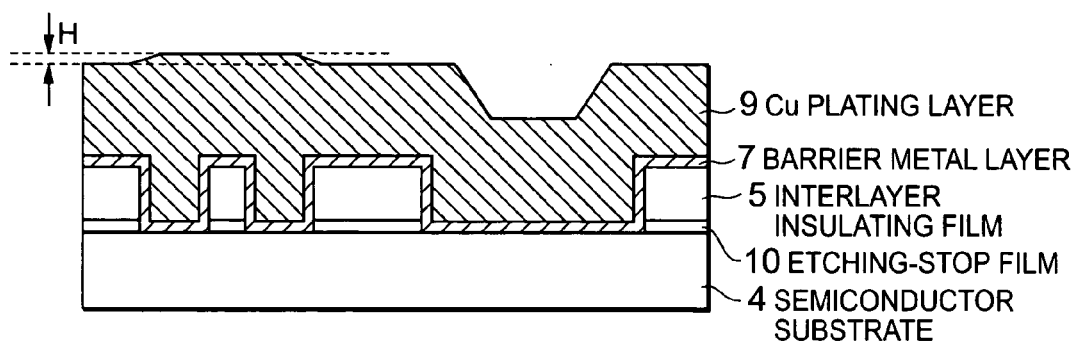
Figure 4E:
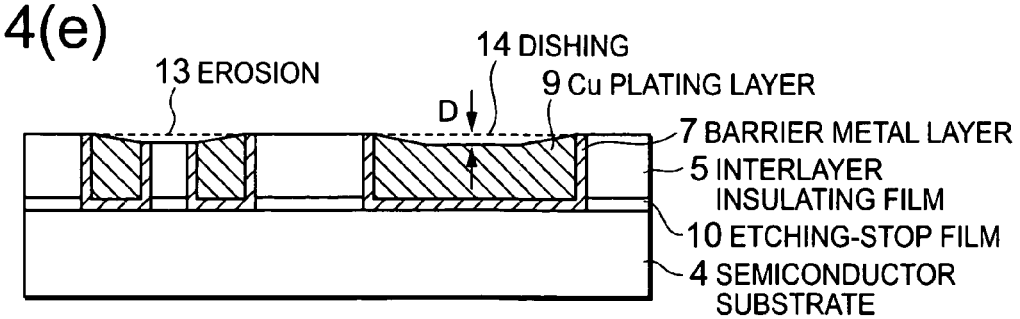

FIG. 2 shows the results of evaluating the number of defects when –17.5 mA/cm² and –35 mA/cm² were applied once or twice each for 1 sec as the second current step 2. As the defects number of places whereon the Cu wirings disposed on the entire surface of an 8-inch wafer were broken or lost was counted using a defect tester manufactured by KLA-Tencor Japan Ltd. What is noticed is the difference of results between twice –17.5 mA/cm² for 1 sec and once –35 mA/cm² for 1 sec, wherein the total of the absolute values of product current values in the backward-current step is the same 35 mA×sec/cm², and in the latter, the number of the defects is reduced to 1/10 or less compared to the former. Thus, since the effect of the number of steps for applying backward current on the number of defects is very large, it is important to perform only one backward-current step.

Next, in order to check whether the protrusion on the fine patterns can be inhibited or not, the following experiments were conducted.

The method of the experiment will be described referring to FIG. 3. As FIG. 3 (a) shows, there was prepared a base material wherein a barrier metal layer 7 and a Cu seed layer 8 were formed on a wiring-trench pattern 6 opened in an interlayer insulating film 5 formed on a semiconductor substrate 4.

Using the current step of Cu electroplating shown in FIG. 1, a Cu plating layer 9 was grown. Backward current was applied (T1 was changed) at each time of FIGS. 3 (b) to (d). Thereafter, samples each having the Cu plating layer 9 grown to the film thickness of FIG. 3 (e), which is constant, were prepared (T3 was adjusted). For comparison, a sample formed using conventional current steps, which had no second current step 2, was also prepared. In the present embodiment, plating was grown under the conditions of a current value of the backward current (A2) of –16 mA/cm², and a second current step 2, i.e., the step time of the backward current (T2) of 5 sec.

Table 2 shows the results of buildups on the wiring-trench pattern 6 (height H in FIG. 3 (a)) when backward current was applied at each time of FIGS. 3 (b) to (d), i.e., T1 is changed, measured using a step measuring instrument.

TABLE 2

| | Conventional example | T1 = FIG. 3 (b) | T1 = FIG. 3 (c) | T1 = FIG. 3 (d) |
|---|---|---|---|---|
| Protrusion H (nm) | 800 | 150 | 50 | 250 |

From Table 2, it was confirmed that the application of the backward-current step, i.e., the second current step, substantially reduced the height H of the protrusion on the wiring-trench pattern 6. The protrusion height H was most suppressed when T1 was set in the timing of FIG. 3 (c), and this was because the concentration gradient of the brightener 16 was cancelled by applying a current in the opposite direction when the area on the wiring-trench pattern, 6 was flattest.

In an actual device, since multi-layer wiring is formed using the damascene process, there are wiring-trench patterns 6 of various wiring widths and wiring depths. The present inventors found as the result of examinations that the protrusion height H on the wiring-trench patterns 6 of various wiring widths and wiring depths can be minimized when the time T1 of the first current step was set so that the product current value was 120 to 2700 mA×sec/cm². Although the effect can be obtained from other than the above-described range, the above-described range is preferable to obtain the highest effect.

Next, in the current steps of FIG. 1, the current value of the first current step 1 (A1) was changed (while maintaining T1×A1 to be constant at 500 mA×sec/cm²) to prepare a sample same as in the above-described experiment shown in FIG. 3 (e), and the protrusion height H on the wiring-trench pattern was measured. The results are shown in Table 3. The buildup height H is shown as the average value of 9 points on the wafer surface. The variation width of the 9-point measurement is also shown in Table 3.

TABLE 3

| A1 (mA/cm²) | Protrusion H (nm) | Variation width (nm) |
|---|---|---|
| 1 | 49.5 | 15.1 |
| 7 | 50.2 | 14.8 |
| 13 | 49.0 | 15.6 |
| 18 | 61.0 | 38.2 |
| 23 | 63.6 | 48.5 |

Table 3 shows that the current value of the first current step 1, A1, little changes the buildup heights H on the wiring-trench patterns 6. However, when A1 is 13 mA/cm2 or below, the variation on the surface is 20 nm or less; whereas, when A1 is larger than 13 mA/cm², increase in variation is seen. The increase in variation is caused by the variation of bottom-up growth in the wafer surface. In the wiring-trench patterns 6 present on the wafer, the adsorption of additives somewhat varies, and a little variation of the burying rate of the wiring-trench patterns 6 is caused by bottom-up growth. If the variation is assumed to be about 5%, even though the 5%-variation is not affected by the growth rate, when considered as a range, the plating conditions of the higher growth rate, that is the higher current value, make the absolute value as the range larger.

From the above, when A1 is larger than 13 mA/cm², since increase in variation is considered, the current value of the first current step 1 (A1) is preferably 13 mA/cm² or below. However, it has already been known from the present inventors' experiments that since the influence of dissolution rate of the Cu seed layer cannot be negligible when the current value of the first current step 1 (A1) is 0.5 mA/cm² or below, the burying properties of the wiring-trench are deteriorated. Therefore, the suppression of the protrusion height H becomes more effective when the current value of the first current step 1 (A1) is set within a range between 0.5 and 13 mA/cm².

Next, in the current steps in FIG. 1, solid films wherein the current values of the third current step 3 (A3) were changed were prepared, and the SIMS analysis in the depth direction was conducted. The C (carbon) contents of the plating film formed in the third step are shown in Table 4 as relative content ratios when the C content in the plating film formed in the first step (A1=7 mA/cm²) is 1.

TABLE 4

| A3 (mA/cm²) | Carbon content |
| --- | --- |
| 1 | 1.15 |
| 7 | 1.09 |
| 13 | 1.08 |
| 16 | 0.51 |
| 25 | 0.48 |

Table 4 shows that the carbon content decreases when the current value of A3 is 16 mA/cm² or above. This is caused by that the adsorption of the additives is once cancelled by the backward-current step. This is considered that when the growth rate of plating after the adsorption of the additives has been cancelled due to the counter current is low, the adsorption of the additives starts again sufficiently; whereas, in the plating rate wherein the current value of A3 is 16 mA/cm² or above, since the growth rate of plating is larger than the adsorption rate of the additives, the quantity of carbon (C), the major component of the additives, taken in the plating film is small. Since it has been confirmed that the wiring formed by the film of the quantity of carbon taken in is small excels in the stress migration resistance, the current value of A3 is preferably 16 mA/cm² or above. However, it has also been confirmed that the plating current more than 90 mA/cm² causes the shortage of Cu-ion supply in the plating solution, the current value of A3 is preferably within a range between 16 and 90 mA/cm².

Although it has been known to the public that the growth of Cu plating can be controlled by the multi-stage current step of Cu plating, it is a novel fact known by the present inventors' findings that the effect that the protrusions on wiring-trench patterns 6 can be minimized by applying backward current for a short time in an adequate timing to cancel the concentration gradient of the brightener 16 without deteriorating the burying properties and film quality.

In each of the above-described current steps of the present invention, each current value may be constant. Specifically, the plating current during each current step may be constant as long as the above-described current values, or the product of the current and the plating time is within the above-described range. No complicated control, such as switching the direction of plating current in pulse, and establishing current-stop periods, as recommended in prior art, is required.

In order to describe the above-described embodiments of the present invention in further detail, a specific example of the damascene process whereto the current steps on the Cu plating of the present invention are applied will be described referring to the drawings.

EXAMPLE

First, the damascene process according to the Example of the present invention will be described referring to FIG. 4. FIG. 4 is a sectional process diagram showing the procedures of the Damascene process whereto the current steps on the Cu plating of the present invention are applied.

First, as FIG. 4 (a) shows, an etching-stop film 10 and an interlayer insulating film 5 are sequentially formed in thickness of 50 nm and 30 nm, respectively, on a semiconductor substrate 4 using the well-known CVD method, plasma CVD method, or the like. Thereafter, an antireflective film 11 of a thickness of about 50 nm for suppressing the reflection of exposure light is deposited on the interlayer insulating film 5, and then a chemical-amplification-type resist of a thickness of about 500 nm for forming wiring-trench patterns 6 are applied to the antireflective film 11, and exposure and development are performed using KrF photo-lithography to form a resist pattern 12.

Next, as FIG. 4 (b) shows, the antireflective film 11, the interlayer insulating film 5, and the etching-stop film 10 are sequentially etched using well-known dry etching to form wiring-trench patterns 6 passing through these films. Thereafter, the resist pattern 12 and the etching-stop film 10 are peeled off by oxygen plasma ashing and wet treatment using an organic peeling solution to remove the residues of the dry etching.

Next, as FIG. 4 (c) shows, a barrier metal layer 7 of tantalum (Ta), tantalum nitride (TaN), or the like for preventing the diffusion of the wiring material and improving adhesiveness is formed in a thickness of about 30 nm, and a Cu seed layer 8 with a thickness of about 100 nm for growing the Cu plating that becomes the wiring material is sequentially formed.

Thereafter, as FIG. 4 (d) shows, a Cu plating layer 9 was formed using the Cu plating method whereto the current steps of the present invention are applied, until all the wiring-trench patterns 6 were filled with Cu. In the Example, a Cu plating layer 9 of a thickness of 500 nm was formed. By the application of the current steps of the present invention, after the Cu plating layer wherein the step H has been significantly reduced, the excessive Cu was polished to planarize the surface using a CMP method as FIG. 4 (e) shows, and the damascene wiring of little erosion or ashing is completed.

For comparison, a sample wherein the Cu plating conditions of the above-described prior art techniques were employed was polished under the same CMP conditions; however, it was confirmed that the time required for completely removing. excessive Cu could be shortened for 10 seconds. The CMP slurry is as expensive as ¥1,000/liter, and the cost reduction of ¥25 for a run was achieved by the shortening of CMP time of 10 seconds.

Next, the plating conditions used in the Example will be described in detail. As FIG. 1 shows, the current steps are composed of the first to third current steps. On the basis of the above-described results of experiments, the time Tn (n: 1 to 3) and the current value An (n: 1 to 3) of each current step were set as shown in Table 5 to grow plating.

TABLE 5

| n | T (sec) | A (mA/cm$^2$) |
|---|---|---|
| 1 | 30 | 10 |
| 2 | 2 | −16 |
| 3 | 30 | 33 |

In the Example, although the third current step 3 was set to 33 mA/cm$^2$, since the concentration gradient of the brightener 16 is cancelled in the second current step 2, and the brightener 16 is evenly adsorbed, the same effect can be obtained when any current values are set.

The protrusion height H of FIG. 4 (*d*) and the depth D of dishing 14 in FIG. 4 (*e*) formed in the Example are shown in Table 6. For comparison, the results of the sample formed using a prior art technique are also shown in Table 6.

TABLE 6

|  | Prior art | Present invention |
|---|---|---|
| Buildup height H (nm) | 900 | 50 |
| Depth of dishing 14 D (nm) | 90 | 30 |

From Table 6, it was confirmed that the protrusion height H on the wiring-trench patterns was significantly reduced by the application of the current steps of the present invention, and as a result, dishing 14 after CMP was significantly suppressed.

Figure 5A:
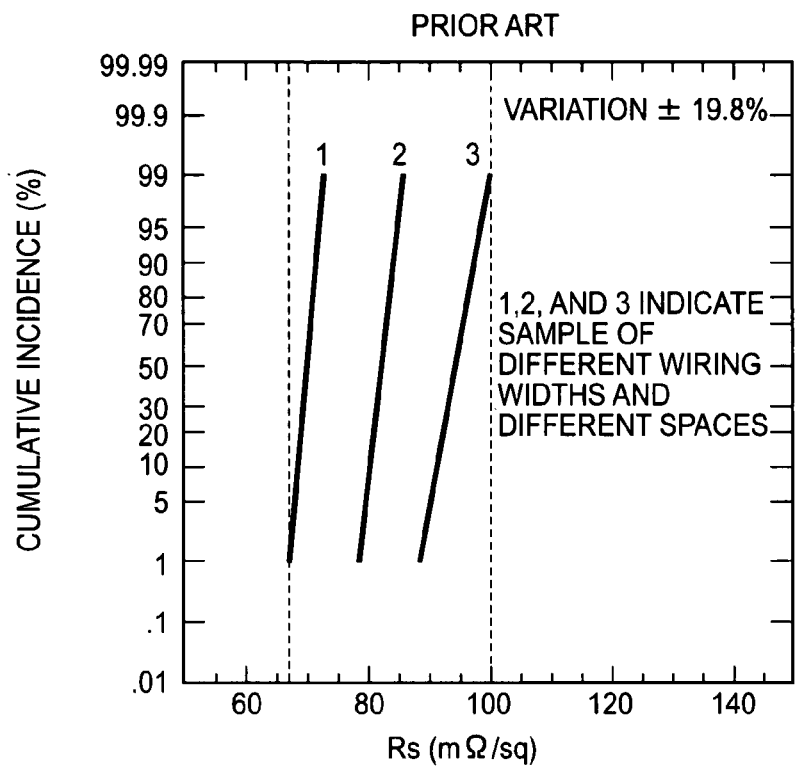
FIGS. 5 (a) and 5 (b) are experimental data diagrams that compare the Rs of the Damascene wiring formed in an embodiment of the present invention to the Rs of the damascene wiring according to a prior art.
Figure 5B:
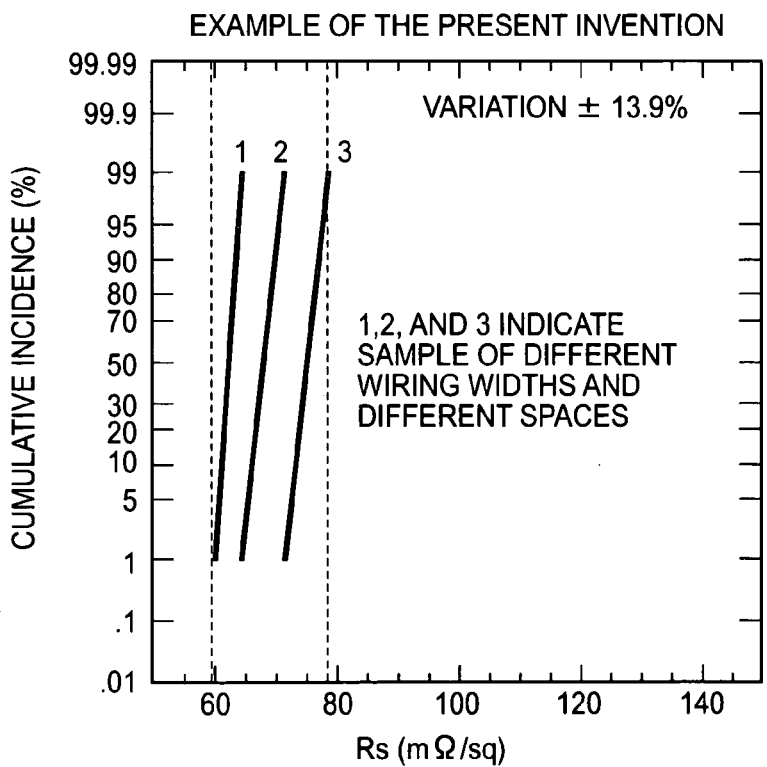
Figure 6A:
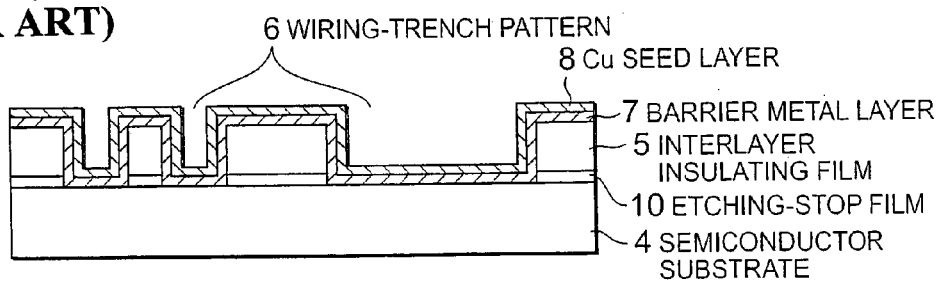
FIGS. 6 (a) to 6 (c) are sectional process diagrams showing the procedures of a conventional damascene process.
Figure 6B:
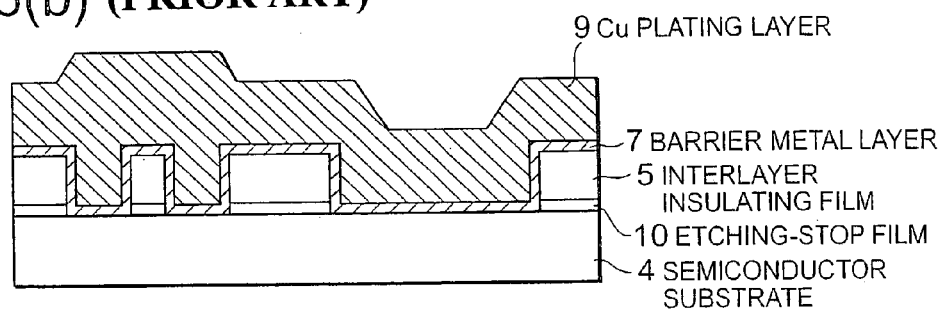
Figure 6C:
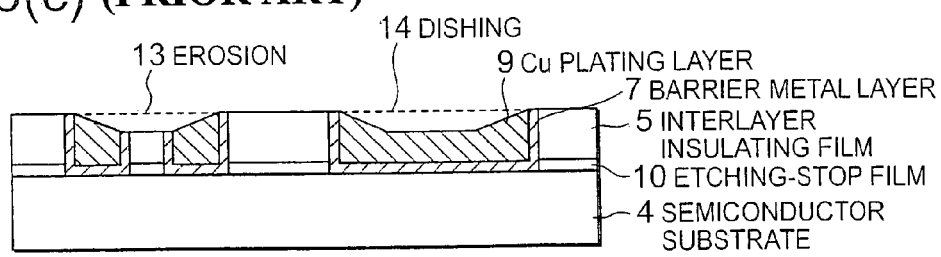
Figure 7A:
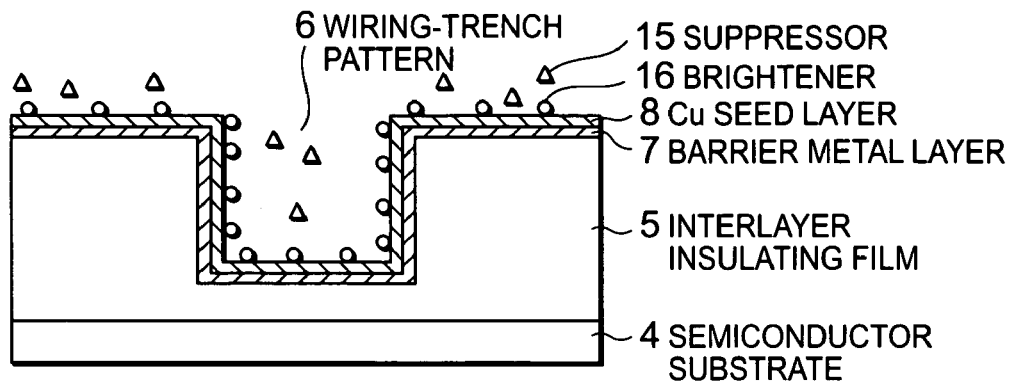
FIGS. 7 (a) to 7 (c) are schematic diagrams for illustrating the effect of the additive in the plating bath used in the present invention.
Figure 7B:
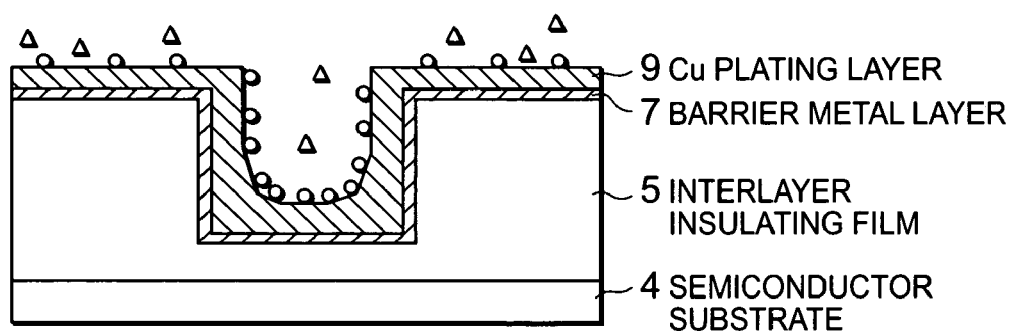
Figure 7C:
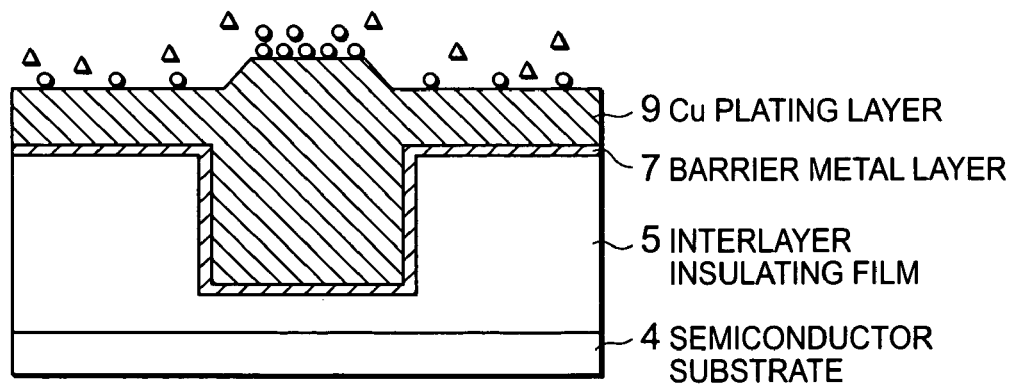

Next, using the sample formed in the Example, the wiring Rs was evaluated. The results are shown in FIG. 5. Since the wiring Rs is a value of the resistance value of wiring divided by the product of wiring width and wiring length, and a value varied only by wiring height, it can be used as an index of the variation of the wiring heights. For comparison, the wiring Rs of a sample prepared by a prior art technique was also measured. In the sample of the Example and each sample of the prior art technique, various patterns with different wiring widths and wiring spaces were formed on a wafer, and the Rs of each pattern was measured. The wiring widths were 0.14 to 4.5 μm, the wiring distances were 0.14 to 4.0 μm, and patterns having optional combinations of the wiring widths and wiring spaces were formed. In FIG. 5, three patterns selected from many patterns are shown as representatives. The variation is a value calculated using the equation:

$$100(R\text{smax}-R\text{smin})/(R\text{smax}+R\text{smin})$$

where Rsmax is the maximum value of Rs, and Rsmin is the minimum value of Rs. FIG. 5 shows that the variation of wiring Rs is significantly reduced, and in other words, wirings of a uniform height can be formed, in the present invention compared to prior art techniques.

It is apparent that the present invention is not limited to the above embodiments, but may be modified and changed without departing from the scope and spirit of the invention.

What is claimed is:

1. A method of manufacturing a semiconductor device comprising a process for forming a seed layer in a via hole or a wiring-trench formed in an interlayer insulating film formed on a semiconductor substrate, and then burying a wiring material using an electroplating method, wherein said electroplating method includes a current step for flowing a current in the direction opposite to the direction for growing the plating so as to cancel a concentration gradient of a brightener which accelerates the growth of plating.

2. The method of manufacturing a semiconductor device according to claim 1, wherein said current step comprises three steps: a first step for flowing a current only in the direction for growing the plating; a second step for flowing a current only in the direction opposite to the direction for growing the plating; and a third current step for flowing only in the direction identical to said first step; in the order of said first, second, and third steps.

3. The method of manufacturing a semiconductor device according to claim 1, wherein said step flowing a current only in the direction opposite to the direction for growing the plating is configured so that the absolute value of the product of the current and the time is within a range between 1.0 and 120 mA×sec/cm2.

4. The method of manufacturing a semiconductor device according to claim 2, wherein said second current step is configured so that the absolute value of the product of the current and the time is within a range between 1.0 and 120 mA×sec/cm2.

5. The method of manufacturing a semiconductor device according to claim 2, wherein said first current step is configured so that the product of the current and the time is within a range between 120 and 2700 mA×sec/cm2.

6. The method of manufacturing a semiconductor device according to claim 4, wherein said first current step is configured so that the product of the current and the time is within a range between 120 and 2700 mA×sec/cm2.

7. The method of manufacturing a semiconductor device according to claim 2, wherein the current value of said first current step is within a range between 0.5 and 13 mA/cm2.

8. The method of manufacturing a semiconductor device according to claim 4, wherein the current value of said first current step is within a range between 0.5 and 13 mA/cm2.

9. The method of manufacturing a semiconductor device according to claim 2, wherein the current value of said third current step is within a range between 16 and 90 mA/cm2.

10. The method of manufacturing a semiconductor device according to claim 4, wherein the current value of said third current step is within a range between 16 and 90 mA/cm2.

11. The method of manufacturing a semiconductor device according to claim 6, wherein the current value of said third current step is within a range between 16 and 90 mA/cm2.

12. The method of manufacturing a semiconductor device according to claim 1, wherein said wiring material is copper.

* * * * *